(12) United States Patent
Caron et al.

(10) Patent No.: US 8,482,927 B2
(45) Date of Patent: Jul. 9, 2013

(54) BACKPLANE ELECTRONIC CIRCUIT BOARD OF AN ELECTRONIC APPARATUS, IN PARTICULAR FOR AN AIRCRAFT

(75) Inventors: Jean-Christophe Caron, Leguevin (FR); Vincent Rebeyrotte, Colomiers (FR)

(73) Assignee: Airbus Operations S.A.S., Toulouse (FR)

( * ) Notice: Subject to any disclaimer, the term of this patent is extended or adjusted under 35 U.S.C. 154(b) by 66 days.

(21) Appl. No.: 13/281,847

(22) Filed: Oct. 26, 2011

(65) Prior Publication Data
US 2012/0106114 A1 May 3, 2012

(30) Foreign Application Priority Data
Oct. 28, 2010 (FR) ..................................... 10 58881

(51) Int. Cl.
*H05K 1/14* (2006.01)
(52) U.S. Cl.
USPC ........... 361/742; 361/736; 361/758; 361/804; 361/809
(58) Field of Classification Search
USPC ................ 361/736, 742, 752, 758, 788, 790, 361/796, 804, 809
See application file for complete search history.

(56) References Cited

U.S. PATENT DOCUMENTS

| 5,348,482 | A | | 9/1994 | Rudy, Jr. et al. |
| 5,388,995 | A | * | 2/1995 | Rudy et al. ........................ 439/61 |
| 5,711,677 | A | * | 1/1998 | Mui et al. ......................... 439/64 |
| 6,362,968 | B1 | | 3/2002 | Lajara et al. |
| 7,180,751 | B1 | * | 2/2007 | Geschke et al. ............... 361/788 |
| 2002/0180554 | A1 | | 12/2002 | Clark et al. |
| 2008/0101049 | A1 | * | 5/2008 | Casto et al. .................... 361/788 |
| 2010/0188831 | A1 | * | 7/2010 | Ortet .............................. 361/788 |

FOREIGN PATENT DOCUMENTS
FR 2 917 905 12/2008

OTHER PUBLICATIONS

French Preliminary Search Report issued on Jun. 16, 2011 in corresponding French Application No. 10 58881 filed on Oct. 28, 2010 (with an English Translation of Categories).

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A backplane electronic circuit board of an electronic apparatus (10) comprises an interface connector with an external system and two interface boards (22, 23) connected to one another, a first interface board (22) being connected to the said interface connector and a second interface board (23) being intended for the connection of a set of electronic circuit boards of the said electronic apparatus (10).
The backplane electronic circuit board (20) comprises reinforcement means (30, 40) installed between the said two interface boards (22, 23).
Use in particular in an electronic apparatus on board an aircraft.

9 Claims, 4 Drawing Sheets

BACKPLANE ELECTRONIC CIRCUIT BOARD OF AN ELECTRONIC APPARATUS, IN PARTICULAR FOR AN AIRCRAFT

This invention relates to a backplane electronic circuit board of an electronic apparatus.

In general, this invention relates to the reinforcement of an electronic apparatus, in particular on board an aircraft, and thus subjected to considerable vibratory stresses.

More generally, this invention relates to the protection of the on-board electronic apparatuses, which are subjected to considerable vibratory stresses during their use.

In particular, in an aircraft, the electronic apparatuses are exposed to vibrations and their reliability thus is reduced in the course of time.

In certain extreme cases, the vibrations even may lead to an irreparable loss of certain electrical functions of the electronic apparatus.

In general, an electronic apparatus comprises a backplane electronic circuit board, installed mechanically on a base, to which a set of electronic circuit boards comes to be connected.

The backplane electronic circuit board generally comprises an interface connector with a system external to the electronic apparatus.

In an aircraft application, this interface connector is adapted for connecting the electronic apparatus with the electrical means of the aircraft.

The backplane electronic circuit board also comprises two interface boards connected to one another, a first interface board being connected to the interface connector and a second interface board being intended for the connection of the set of electronic circuit boards of the electronic apparatus.

Under the effect of vibrations generated during operation of the aircraft, the entire electronic apparatus is caused to become deformed.

In particular, the backplane electronic circuit board is especially sensitive to vibratory phenomena since they bring about a considerable fatigue at the interfaces and the connections, in particular the connections between the interface connector and the first interface board, but also the connections of components installed on the backplane electronic circuit board.

The vibrations particularly may bring about mechanical damage through friction at the contacts in the interface zones of the interface connector and the interface boards.

This mechanical damage may go as far as the breaking of certain connection pins, thus destroying functionalities of the backplane electronic circuit board.

In the document FR 2 848 773 there thus is known the installation of a stayed structure in order to limit the effects of the vibrations on the durability of the electronic components and on the connections for large-sized electronic circuit boards.

This document thus proposes to arrange stayed structures on each electronic circuit board face, making it possible to reduce the mechanical effects of the vibrations.

These stayed structures, however, require a mechanical application of voltage in order to place the electronic circuit board under mechanical constraint.

In this way they complicate the installation of the electronic apparatus and increase the space requirement for the electronic circuit boards themselves.

Furthermore, these stayed structures are limited to the electronic circuit boards of the electronic apparatus, and do not enable protection of the backplane electronic circuit board on which the numerous interface and connection zones are particularly sensitive to vibrations to which the on-board electronic apparatus in the aircraft is subjected.

This invention proposes a solution for delaying the mechanical fatigue linked to the vibrations and thus increasing the reliability of an electronic apparatus by minimizing the relative displacements of the various elements making up the backplane electronic circuit board of this electronic apparatus.

To this end, this invention relates to a backplane electronic circuit board of an electronic apparatus comprising an interface connector with an external system and two interface boards connected to one another, a first interface board being connected to the said interface connector and a second interface board being intended for the connection of a set of electronic circuit boards of the said electronic apparatus.

According to the invention, the backplane electronic circuit board comprises reinforcement means installed between the said two interface boards, the reinforcement means comprising stiffeners extending along a longitudinal axis parallel to the plane of the said two interface boards and forming crosspieces between two faces arranged opposite the said two interface boards.

Thus, by installing reinforcement means in the existing space between the two interface boards of the backplane electronic circuit board, it is possible to limit the relative deformation of these interface boards and in this way to protect the existing connections.

Furthermore, since the reinforcement means fit into the existing space requirement, their installation does not generate any modifications of the backplane electronic circuit board, or of the electronic apparatus itself, and the installation and positioning time for the reinforcement means is insignificant since these reinforcement means are installed between the two interface boards at the time of their connection to one another.

By virtue of the use of elongated stiffeners, it is possible, because of these crosspieces, to maintain the spacing between the two faces arranged opposite the interface boards and in this way to limit the relative deformations of these two interface boards, thus avoiding a premature wearing out of the connection pins.

In practice, the reinforcement means comprise first reinforcement means comprising a frame arranged opposite the periphery of the interface connector.

In this way the relative displacements of the contacts at the interface connector connected to the first interface board of the backplane electronic circuit board are greatly reduced and the mechanical wear thus is greatly mitigated.

The first reinforcement means thus make it possible to limit the mechanical damage, through friction, of the contacts of the interface connector.

Furthermore, the reinforcement means comprise second reinforcement means arranged between two free edges opposite the two interface boards.

The positioning of these second reinforcement means at the free edges of the interface boards makes it possible to mitigate the deformation of the interface boards and in this way protect the components and their connection on these interface boards.

These second reinforcement means thus make it possible to improve the durability of the components on the interface boards.

According to a second aspect, this invention relates to an on-board electronic apparatus, in particular an avionic apparatus, comprising a backplane electronic circuit board in accordance with the invention.

This on-board electronic apparatus has characteristics and advantages similar to those described above.

According to one embodiment characteristic, the backplane electronic circuit board is installed in a stand of the on-board electronic apparatus, the said reinforcement means comprising fastening feet installed on the stand of the electronic apparatus.

In this way, the fastening feet enable a mechanical take-up on the stand of the electronic apparatus of the stresses borne by the reinforcement means installed on the backplane electronic circuit board, thus ensuring the rigidity of the on-board electronic apparatus.

Finally, according to a third aspect, this invention relates to an aircraft comprising one or more on-board electronic apparatuses in accordance with the invention.

This aircraft has characteristics and advantages similar to those described above in connection with the on-board electronic apparatus.

Other features and advantages of the invention also will become apparent in the description below.

In the attached drawings, provided by way of non-limitative examples:

An electronic apparatus in accordance with an embodiment of the invention first of all is going to be described with reference to FIG. 1.

Electronic apparatus 10 is intended to be on board a vehicle, and particularly an aircraft.

Such an electronic apparatus has an overall parallelepipedal shape and is made up of a stand 11 closed off with a hood (not shown).

Figure 1:
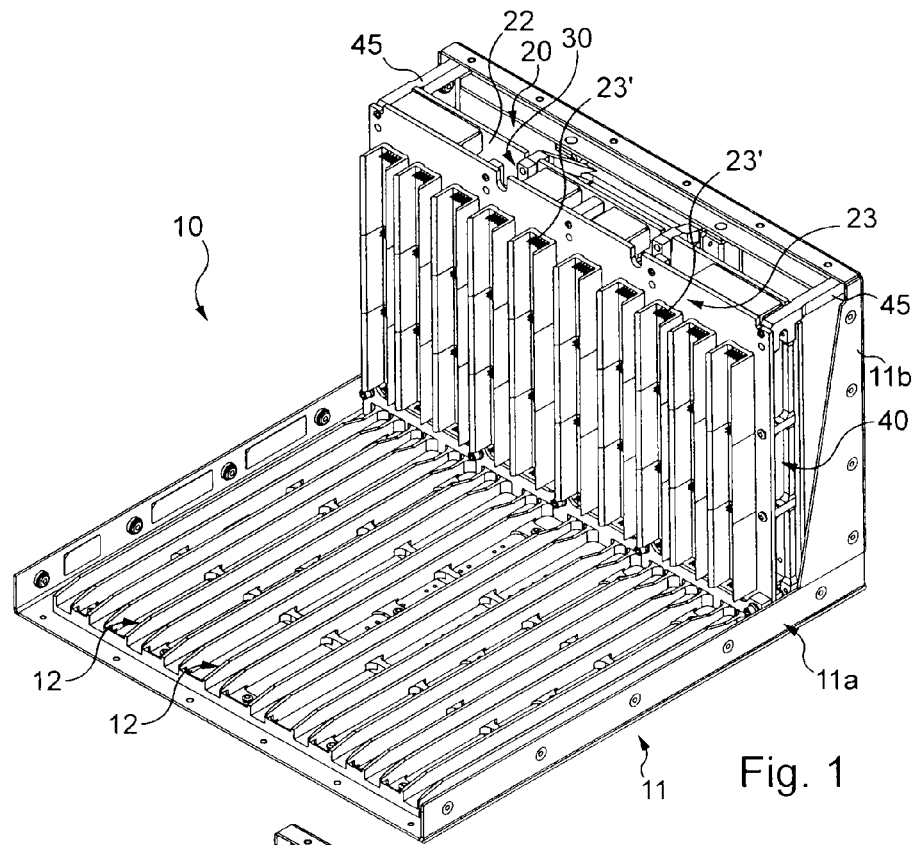
FIG. 1 is a perspective view of an electronic apparatus in accordance with an embodiment of the invention, a protective hood having been removed.
Figure 2:
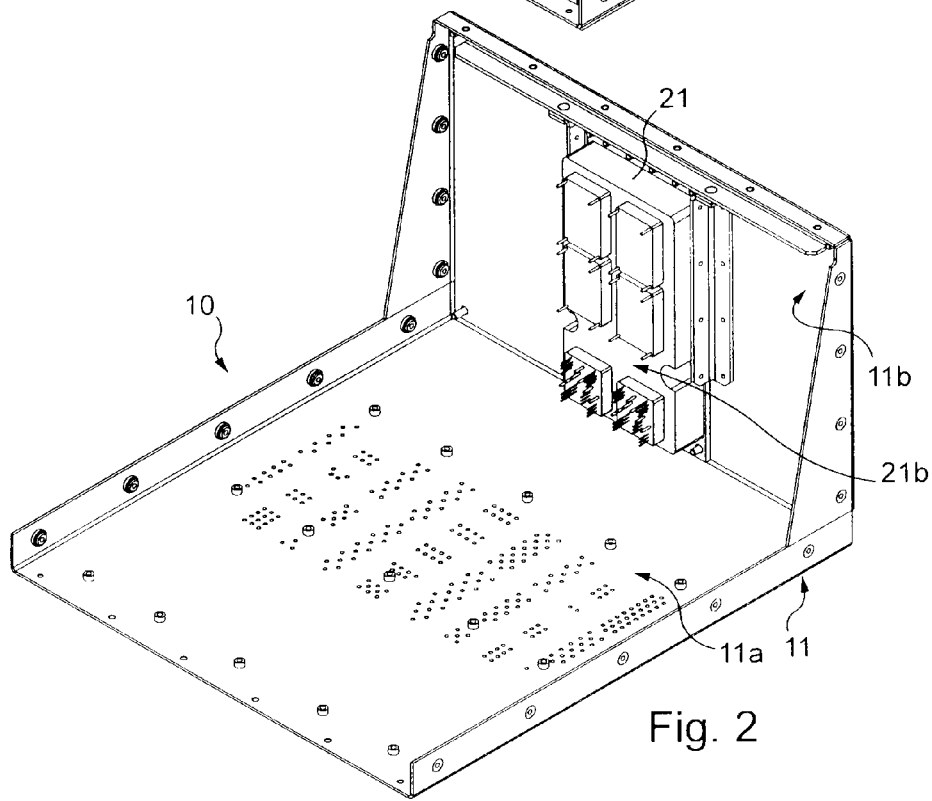
FIG. 2 is a view similar to FIG. 1 in which the two interface boards and the reinforcement means have been removed.

As clearly illustrated also in FIG. 2, stand 11 of electronic apparatus 10 comprises a first part making up base 11a of stand 11, shown horizontally on FIGS. 1 and 2 and a second part, shown vertically in FIGS. 1 and 2, and making up the back 11b of stand 11 of electronic apparatus 10.

Back 11b of stand 11 thus is installed at right angles to base 11a of stand 11.

The protective hood (not shown) may be placed over this stand so as to close off the upper face, parallel to base 11a, and the side faces, extending in a plane perpendicular to base 11a and back 11b of stand 11.

The front face, opposite back 11b of the electronic apparatus, may be opened or closed by means of a cover (not shown).

A backplane electronic circuit board 20 which will be described in detail later is installed on back 11b of stand 11.

This backplane electronic circuit board is intended in particular to form the interface between electronic apparatus 10 and its environment, and particularly in this application, the avionic system.

In this embodiment, base 11a of stand 11 also comprises a certain number of grooves 12 adapted for accommodating respectively a set of electronic boards of the electronic apparatus, intended to be connected to backplane electronic circuit board 20.

The installation of a set of electronic boards in an electronic apparatus and their connection to a backplane electronic circuit board are well known to the individual skilled in the art and do not need to be described in further detail here.

A backplane electronic circuit board in accordance with an embodiment of the invention now is going to be described with reference to FIGS. 2 and 3.

This backplane electronic circuit board 20 comprises first of all an interface connector 21 making it possible to connect the electronic apparatus with an external electrical and mechanical system.

As clearly illustrated on FIG. 2, this interface connector 21 comprises a first face (not visible) intended to be installed in the back 11b of stand 11 and thus to open onto the outer face of back 11b of the electronic apparatus in order to enable the connection of the electronic apparatus to the external system in known manner.

Figure 3:
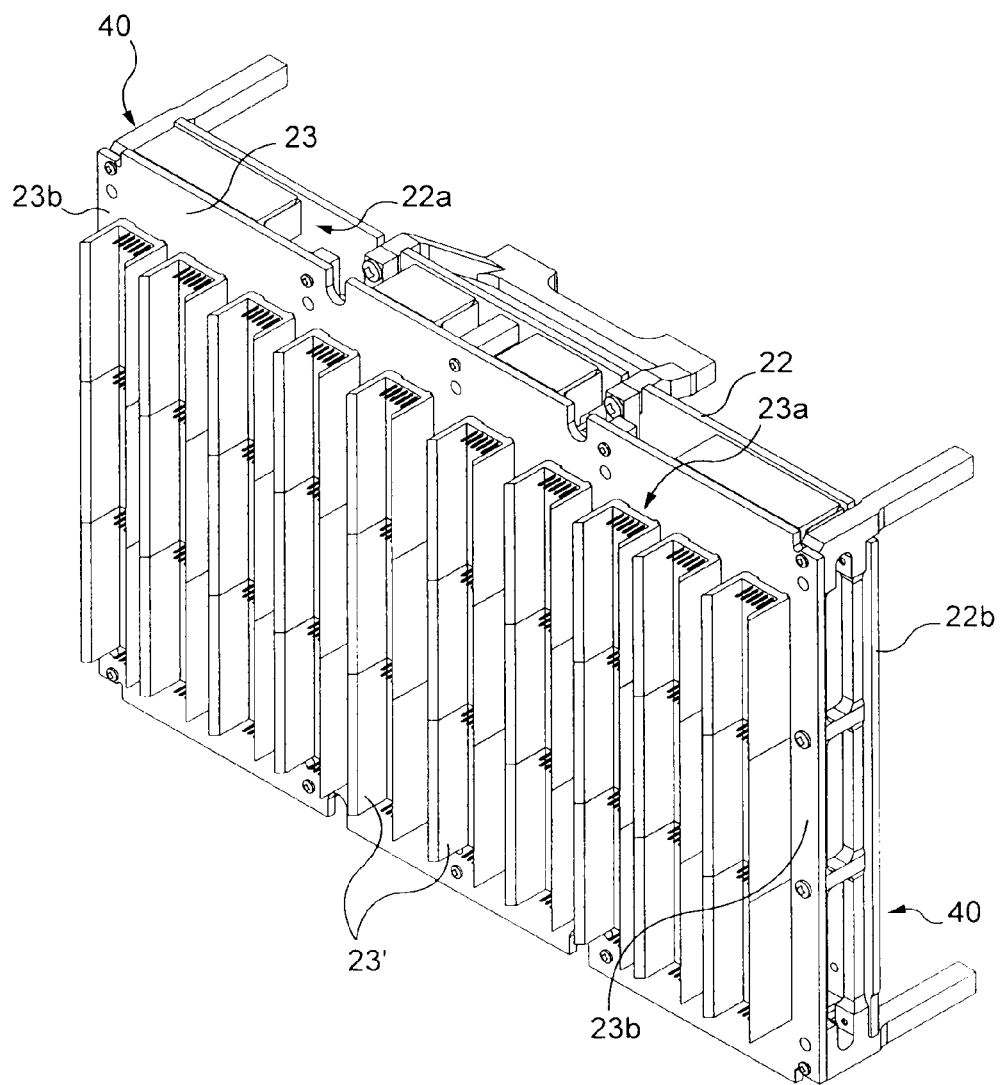
FIG. 3 is a perspective view of the two interface boards of the apparatus of FIG. 1, and the reinforcement means installed between same.

Furthermore, interface connector 21 comprises a second face 21b equipped with a set of contacts intended to connect this interface connector 21 to a first interface board 22 such as illustrated on FIG. 3.

Figure 7:
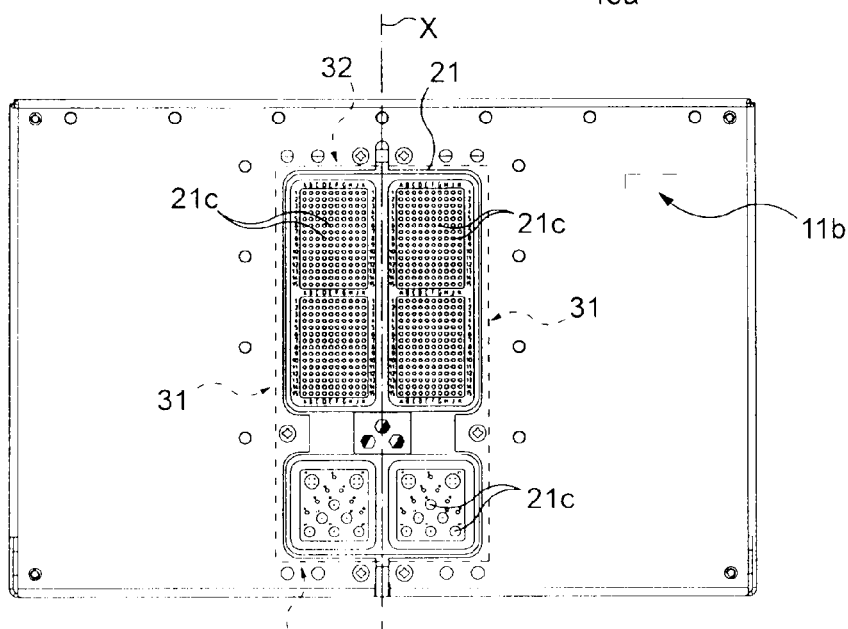
FIG. 7 is a schematic view symbolizing the installation of the first reinforcement means opposite the interface connector of the backplane electronic circuit board of FIG. 1.

As clearly illustrated on FIGS. 2 and 7, the various contacts 21c of interface connector 21, of varied shapes and sizes, are arranged in second face 21b, more or less symmetrically in relation to a central longitudinal axis X of interface connector 21.

This central longitudinal axis X corresponds on the Figures to a vertical axis, extending parallel to back 11b of stand 11 and perpendicular to base 11a of stand 11.

In this embodiment, interface connector 21 moreover is positioned more or less in the center of back 11b of stand 11 of electronic apparatus 10.

Furthermore, as clearly illustrated on FIG. 3, backplane electronic circuit board 20 comprises, in addition to first interface board 22 mentioned above, a second interface board 23, the two interface boards 22, 23 being connected to one another.

Whereas first interface board 22 is connected to interface connector 21, second interface board 23 is intended for connection of the set of electronic boards (not shown) of electronic apparatus 10.

As clearly illustrated on FIG. 3, this second interface board 23 thus comprises a set of grooves 23' intended for the vertical installation of the electronic circuit boards of electronic apparatus 10 intended to be connected mechanically and electronically to second interface board 23.

Figure 4:
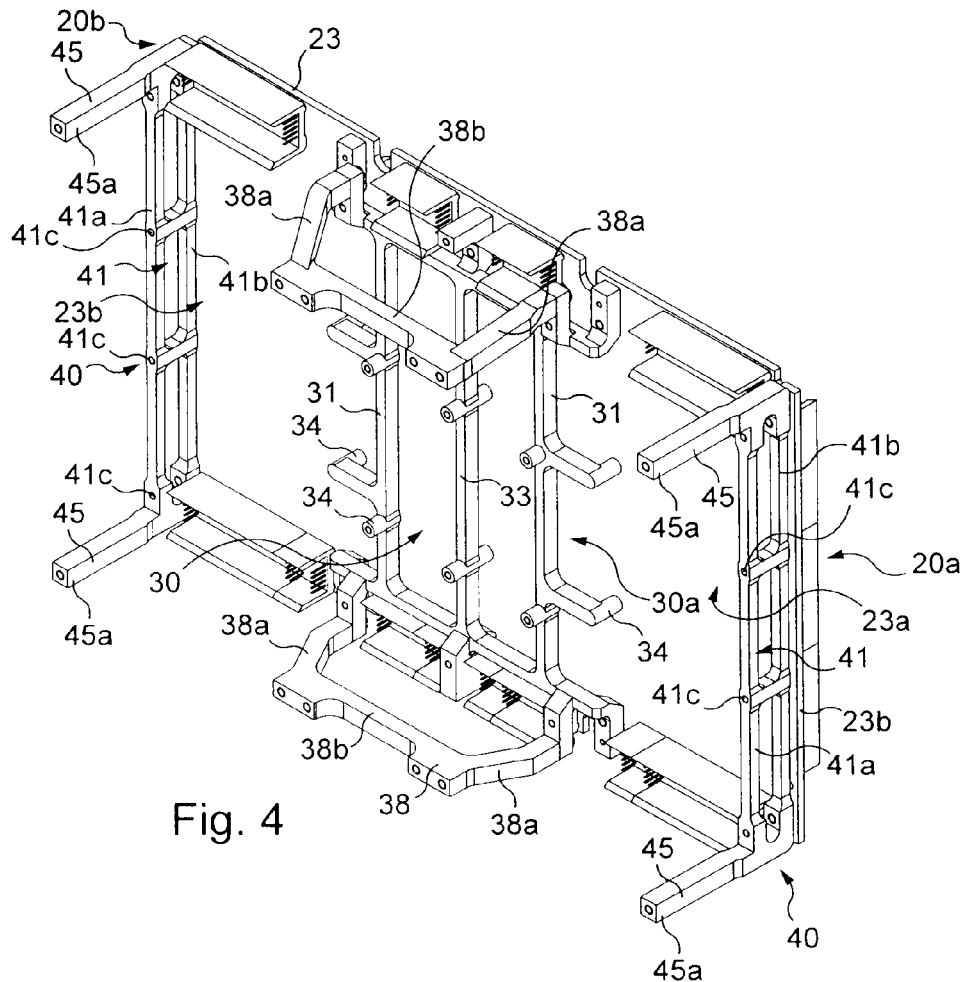
FIG. 4 is a view similar to FIG. 3, in which a first interface board has been removed.

As clearly illustrated on FIGS. 3 and 4, backplane electronic circuit board 20 comprises reinforcement means 30, 40 installed between the two interface boards 22, 23.

In general, first reinforcement means 30 are arranged more or less in the center of backplane electronic circuit board 20, at interface connector 21.

Second reinforcement means 40 are arranged at two free edges opposite the two interface boards 22, 23.

As clearly illustrated on FIG. 4, reinforcement means 30, 40 comprise in particular stiffeners 31, 41 that extend along a longitudinal axis parallel to the plane of the two interface boards 22, 23.

In this embodiment, these stiffeners 31, 41 also extend parallel to the central longitudinal axis X of central connector 21 such as described above on FIG. 7.

In this way, stiffeners 31, 41 extend in the plane of the two interface boards 22, 23 and are perpendicular to base 11a of stand 11 of the electronic apparatus.

These stiffeners 31, 41 thus generally form spacers between two faces 22a, 23a arranged opposite the two interface boards 22, 23.

Figure 5:
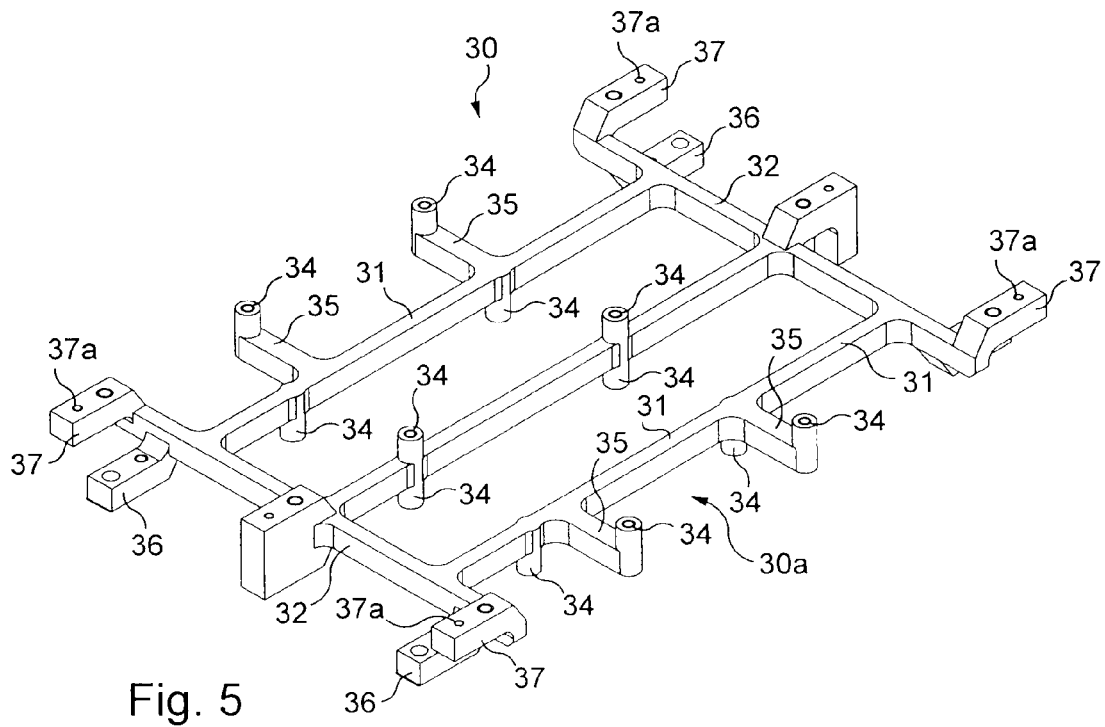
FIG. 5 is a perspective view illustrating first reinforcement means.

First reinforcement means 30 intended to be arranged more or less around interface connector 21 of backplane electronic circuit board 20 now are going to be described in further detail with reference to FIGS. 4 and 5.

In general, these reinforcement means 30 comprise a frame 30a comprising two longitudinal stiffeners 31 connected by crossbars 32 thus forming a more or less rectangular frame 30a.

As schematized on FIG. 7, this frame 30a is arranged at the periphery of interface connector 21.

Furthermore, in this embodiment, first reinforcement means 30 also comprise an arm 33 extending into frame 30a, parallel to longitudinal stiffeners 31, between the two crossbars 32 of frame 30a.

This arm 33 is arranged in the center of frame 30a so that it is arranged opposite the central longitudinal axis X of interface connector 21 when first reinforcement means 30 are installed opposite interface connector 21.

As clearly illustrated on FIG. 4, frame 30a of first reinforcement means 30 is arranged between the two interface boards 22, 23 and comprises a series of fastening studs 34 installed in contact with one or the other of the two interface boards 22, 23. Fastening studs 34 thus are positioned on one side or the other of the plane formed by frame 30a.

Fastening studs 34 are installed directly on longitudinal stiffeners 31 or arm 33 so as to come into contact with one or the other of the two faces 22a, 23a arranged opposite the two interface boards 22, 23.

Frame 30a also comprises, at longitudinal stiffeners 31, fastening wings 35 extending perpendicular to longitudinal stiffeners 31 and in the plane of frame 30a for the offset installation of a certain number of fastening studs 34, thus enabling a better distribution of the points for fastening first reinforcement means 30 onto the two interface boards 22, 23.

First reinforcement means 30 also comprise a first series of securing lugs 36 extending beyond frame 30a from crossbars 32 and perpendicular to these crossbars 32. They are intended for installation of first reinforcement means 30 on face 23a of second interface board 23.

In this embodiment, first reinforcement means 30 further comprise a second series of securing lugs 37 also extending beyond frame 30a, more or less perpendicular to crossbars 32.

These second securing lugs 37 are intended first of all for the fastening of first reinforcement means 30 to face 22a of first interface board 22.

These securing lugs 37 of the second series also comprise fastening points 37a enabling installing of first fastening feet 38 intended to be installed on the opposite side on stand 11 of the electronic apparatus, and more precisely on back 11b of stand 11.

In this embodiment, as clearly illustrated on FIG. 4, first fastening feet 38 are two in number, installed respectively at the two transverse ends of first reinforcement means 30, at securing lugs 37 installed on transverse edges 32 of frame 30a.

Each fastening foot 38 more precisely comprises two angled arms 38a fastened at a first end to securing lugs 37 of first reinforcement means 30 and at a second end, to a connecting rod 38b intended to be installed by fastening onto back 11b of stand 11 of electronic apparatus 10.

These fastening feet 38 thus make it possible to take up at stand 11 the stresses and vibrations transmitted by interface boards 22, 23 at interface connector 21.

Second reinforcement means 40 now is going to be described with reference to FIGS. 4 and 6.

Second reinforcement means 41 comprise two identical structures installed respectively between two free edges 22b, 23b of the two interface boards 22, 23.

One of the structures of second reinforcement means 41, the other structure being identical, now is going to be described with reference to FIG. 6.

Each stiffener 41 of second reinforcement means 40 thus is made up of a bar 41 that is intended to extend parallel to free edges 22b, 23b of the two interface boards 22, 23.

Each bar 41 thus extends parallel to each transverse edge 20a, 20b of backplane electronic circuit board 20, parallel to the central longitudinal axis X described above.

In this embodiment, and in non-limitative manner, each bar 41 comprises two uprights 41a, 41b connected by crosspieces 42.

Here, each bar 41 thus forms a ladder structure with two crosspieces 42 connecting the two uprights 41a, 41b. The crosspieces are equally distributed in the length of uprights 41a, 41b.

This particular structure makes it possible to reduce the weight of bar 41 while preserving a rigidity at bar 41.

Figure 6:
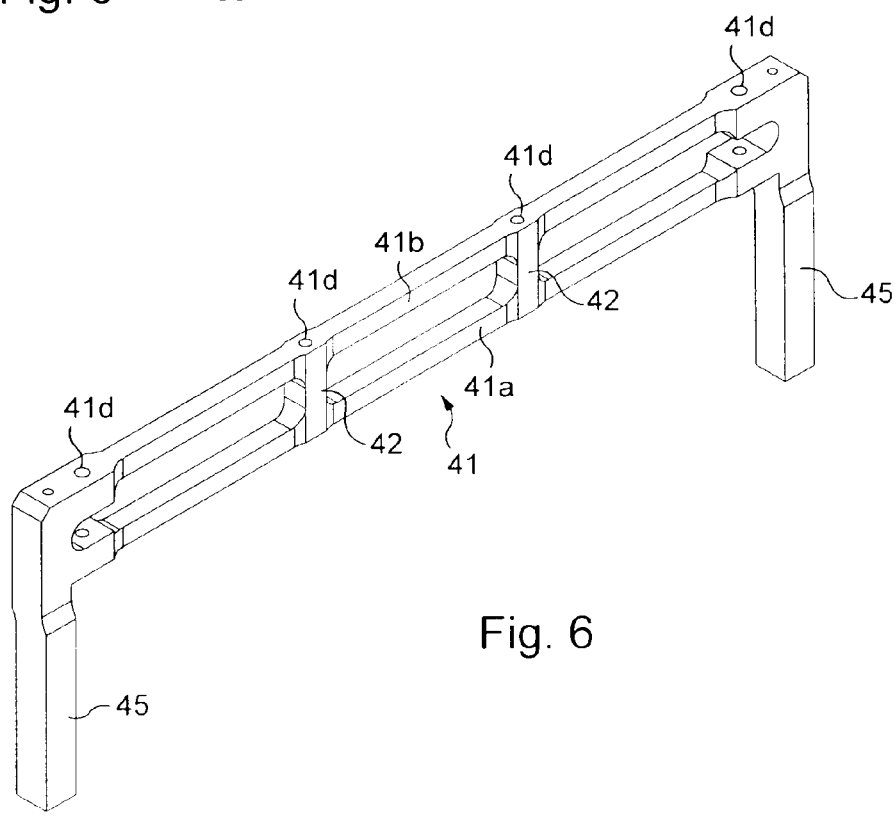
FIG. 6 is a perspective view illustrating second reinforcement means.

As clearly illustrated on FIGS. 4 and 6, a first upright 41a of bar 41 is intended to be fastened at various fastening points 41c to face 22a of first interface board 22, while second upright 41b of bar 41 is intended to be fastened at various fastening points 41d to face 23a of second interface board 23.

Furthermore, in this embodiment, each bar 41 is prolonged at these ends by two fastening feet 45 extending perpendicular to bar 41.

As clearly illustrated on FIG. 4, these fastening feet 45 are intended to extend perpendicular to the plane of the two interface boards 22, 23.

At their free end 45a, these fastening feet 45 comprise fastening means adapted for cooperating with back 11b of stand 11 of electronic apparatus 10.

In this way, as clearly illustrated on FIG. 1, each foot 45 of second reinforcement means 40 is fastened to the corners of back 11b of stand 11 of the electronic apparatus, thus enabling a take-up of the stresses applied on second reinforcement means 40.

Backplane electronic circuit board 20 such as described above thus has a better resistance to mechanical fatigue linked to vibrations.

In particular, first reinforcement means 30 make it possible to limit the relative displacements of the contacts at interface connector 21 by virtue of the rigidity imparted by frame 30a and arm 33 of first reinforcement means 30.

Second reinforcement means 40 in particular make it possible to limit the bending of interface boards 22, 23 at their free edges 22b, 23b at transverse edges 20a, 20b of backplane electronic circuit board 20.

In general, the mitigation of deformations is achieved by virtue of these reinforcement means 30, 40 which make it possible to increase the frequency of the specific modes so as to reduce the relative displacements of interface boards 22, 23 and in this way protect the components installed on these boards.

By virtue of the installation of these reinforcement means 30, 40 between interface boards 22, 23 of backplane electronic circuit board 20, the space requirement of the whole is not changed.

Reinforcement means 30, 40 preferably are made of aluminum having the advantage, particularly in avionic applications, of being inexpensive and above all light in weight.

By way of non-limitative example, for a standard backplane electronic circuit board of an avionic apparatus, the weight added, on the order of 120 g, by first reinforcement means 30, 40 such as described above, represents approximately 0.8% of the total weight of the electronic apparatus, and thus is insignificant.

The installation of reinforcement means 30, 40 may be accomplished easily at the same time as the installation of backplane electronic circuit board 20, in particular during installation of the two interface boards 22, 23 with interface connector 21.

All the fastenings may be accomplished by any known means, and in particular by screwing in the various fastening points provided for this purpose in reinforcement means 30, 40.

Of course, this invention is not limited to the exemplary embodiment described above.

In particular, the backplane electronic circuit board could comprise only first reinforcement means 30, at interface connector 21, or else only second reinforcement means 40 arranged at transverse edges 20a, 20b of backplane electronic circuit board 20.

The invention claimed is:

1. Backplane electronic circuit board of an electronic apparatus, comprising an interface connector with an external system and two interface boards connected to one another, a first interface board being connected to the said interface connector and a second interface board being intended for the connection of a set of electronic circuit boards of said electronic apparatus, wherein said backplane electronic circuit board comprises reinforcement means installed between the said two interface boards, said reinforcement means comprising stiffeners extending along a longitudinal axis (X) parallel to the plane of said two interface boards and forming a crosspiece between two faces arranged opposite said two interface boards.

2. Backplane electronic circuit board in accordance with claim 1, wherein said reinforcement means comprise first reinforcement means comprising a frame arranged opposite the periphery of said interface connector.

3. Backplane electronic circuit board in accordance with claim 2, said interface connector comprising a face equipped with contacts intended to connect said interface connector to said first interface board, said contacts being distributed more or less symmetrically in relation to a central longitudinal axis (X) of said interface connector, wherein said first reinforcement means further comprise a reinforcement arm extending between two crossbars of said frame, opposite the central longitudinal axis (X) of said interface connector.

4. Backplane electronic circuit board in accordance with one of claim 2 or 3, wherein said frame of said first reinforcement means is arranged between said two interface boards and comprises a series of fastening studs installed in contact with one or the other of said two interface boards.

5. Backplane electronic circuit board in accordance with claim 1, wherein said reinforcement means comprise second reinforcement means arranged between two free edges opposite said two interface boards.

6. Backplane electronic circuit board in accordance with claim 5, wherein said second reinforcement means comprise, at each transverse edge of said backplane electronic circuit board, a bar extending parallel to said free edges of said two interface boards, each bar comprising two uprights connected by crosspieces.

7. On-board electronic apparatus, in particular an avionic apparatus, comprising a backplane electronic circuit board in accordance with claim 1.

8. On-board electronic apparatus in accordance with claim 7, wherein said backplane electronic circuit board is installed in a stand of said on-board electronic apparatus, said reinforcement means comprising fastening feet installed on said stand of said electronic apparatus.

9. Aircraft, comprising one or more on-board electronic apparatuses in accordance with claim 7.

* * * * *